(12) United States Patent
Kalnitsky et al.

(10) Patent No.: US 6,593,640 B1
(45) Date of Patent: Jul. 15, 2003

(54) BIPOLAR TRANSISTOR AND METHODS OF FORMING BIPOLAR TRANSISTORS

(75) Inventors: Alexander Kalnitsky, Portland, OR (US); Sudarsan Uppili, Portland, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/114,526

(22) Filed: Apr. 1, 2002

(51) Int. Cl.[7] .............................................. H01L 27/082
(52) U.S. Cl. ....................... 257/565; 257/588; 257/592
(58) Field of Search ................................ 438/309, 312, 438/365, 366, 367, 368, 369, 520; 257/565, 571, 572, 588, 592

(56) References Cited

U.S. PATENT DOCUMENTS

| | | | | |
|---|---|---|---|---|
| 5,930,635 A | * | 7/1999 | Bashir et al. ............... | 438/309 |
| 6,248,650 B1 | * | 6/2001 | Johnson ...................... | 438/552 |
| 6,426,265 B1 | * | 7/2002 | Chu et al. .................... | 438/312 |
| 2002/0061627 A1 | * | 5/2002 | Kovacic ....................... | 438/309 |
| 2002/0076893 A1 | * | 6/2002 | Howard et al. ............. | 438/374 |

* cited by examiner

Primary Examiner—Tuan H. Nguyen
(74) Attorney, Agent, or Firm—Perkins Coie LLP

(57) ABSTRACT

A bipolar transistor comprises a base region and an an extrinsic base region being located generally adjacent to the base region. The extrinsic base region has implanted therein a dopant and a dopant diffusion-retarding substance. The dopant diffusion-retarding substance serves to reduce the diffusion of the dopant into the base region. Preferably, the dopant and diffusion-retarding substances are implanted such that there is a buffer zone in the extrinsic base region immediately adjacent to the base region into which the dopant may diffuse after implantation. The dopant may for example be boron, and the dopant diffusion-retarding substance may for example be a group IV element such as carbon or germanium.

11 Claims, 5 Drawing Sheets

BIPOLAR TRANSISTOR AND METHODS OF FORMING BIPOLAR TRANSISTORS

FIELD OF THE INVENTION

The invention generally relates to the formation of semiconductor devices, and more particularly, to the formation of a bipolar transistor in which migration of dopants is reduced.

BACKGROUND OF THE INVENTION

As semiconductor devices have become smaller, the possibility of performance degradation from inter-diffusion between adjacent structures in the semiconductor devices has increased. Accordingly, it would be desirable to design structures that reduce such inter-diffusion, and develop associated manufacturing methods for such structures.

SUMMARY OF THE INVENTION

According to one aspect of the invention provided is a method of reducing lateral diffusion of a dopant in a transistor, comprising the steps of:
forming a first region of semiconductor in or on a semiconductor substrate;
forming a second region of semiconductor in or on the semiconductor substrate, the second region being located generally adjacent to the first region in a direction parallel to a general plane of the semiconductor substrate;
implanting or depositing a dopant diffusion-retarding substance in the first region; and
implanting or depositing the dopant in the first region.

According to one aspect of the invention, the step of implanting or depositing the dopant in the first region comprises the step of:
implanting or depositing the dopant in the first region such that there is a buffer zone, into which the dopant may diffuse, between a region in which the dopant is initially implanted and the second region.

The method may further comprise the step of:
determining a diffusion distance for the buffer zone based on an expected reduced diffusion as a result of the presence in the first region of the dopant diffusion-retarding substance.

According to another aspect of the invention, the first region forms a polysilicon layer and the second region forms a base, and the method further comprises the steps of:
forming a third region of semiconductor material for use as an emitter;
forming a layer of photoresist on the third region of semiconductor material;
patterning the layer of photoresist; and
removing part of the third region as defined by the patterned layer of photoresist to define an emitter, wherein the step of implanting or depositing the dopant comprises:
implanting or depositing the dopant using the patterned layer of photoresist as a mask.

In one embodiment, the patterned layer of photoresist extends partially over the first region to define a buffer zone into which the dopant may diffuse after implantation or deposition.

The dopant diffusion-retarding substance may be a group IV element, for example carbon or germanium.

According to another aspect of the invention, provided is a bipolar transistor comprising:

a first polysilicon region formed in or on a semiconductor substrate,
a second base region formed in or on the semiconductor substrate, the second polysilicon region being located generally adjacent to the first base region in a direction parallel to a general plane of the semiconductor substrate, the;
the first polysilicon region including therein a dopant and a dopant diffusion-retarding substance.

In one embodiment of the transistor, there is a buffer zone into which the dopant may diffuse, the buffer zone being between a region in which the dopant is initially implanted and the second base region.

In such a case, preferably a diffusion distance for the buffer zone is based on an expected reduced diffusion as a result of the presence in the first polysilicon region of the dopant diffusion-retarding substance.

The transistor may further comprise:
a third emitter region formed of semiconductor material, wherein the buffer zone is defined by an overlap between the third emitter region and the first polysilicon region.

The dopant diffusion-retarding substance may be a group IV element, for example carbon or germanium.

According to a further aspect of the invention provided is a bipolar transistor comprising:
a base region,
an extrinsic base region being located generally adjacent to the base region,
the extrinsic base region having implanted therein a dopant and a dopant diffusion-retarding substance, the dopant and dopant diffusion-retarding substance being implanted such that there is a buffer zone in the extrinsic base region immediately adjacent to the base region into which the dopant may diffuse after implantation.

Preferably, the buffer region is defined by an overhang of an emitter region over the base region.

DETAILED DESCRIPTION OF THE INVENTION

Figure 1:
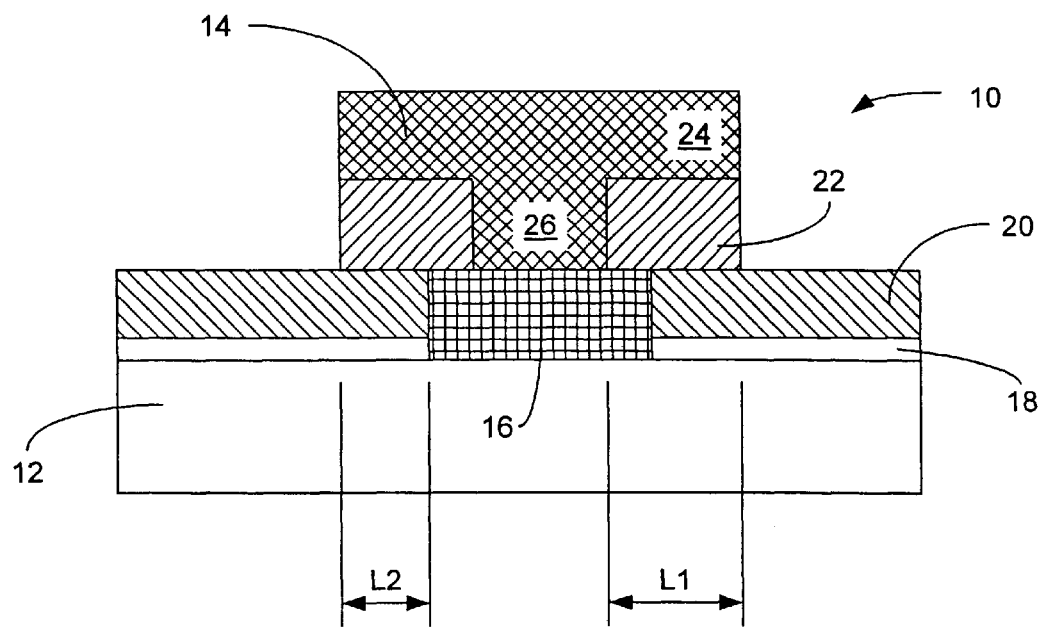
FIG. 1 is a schematic diagram showing a cross section through an exemplary n-p-n bipolar transistor according to the invention.

FIG. 1 shows an exemplary bipolar transistor according to the invention, generally indicated by the numeral 10. The transistor 10 includes a collector region 12, an emitter 14 and a base 16. In the illustrated embodiment, the collector region 12 and the emitter 14 are doped with appropriate levels of donor impurities (e.g. arsenic or phosphorus) to be n-type semiconductors, and the base 16 is doped with appropriate levels of acceptor impurities (e.g. boron) to be a p-type semiconductor region. The transistor is thus an n-p-n transistor, but of course it will be appreciated that the invention is applicable to p-n-p transistors as well.

Located above the collector region 12 around the base 16 is an oxide layer 18 that serves to isolate an extrinsic base polysilicon layer 20 from the collector region 12. The p+base polysilicon layer 20 serves to make electrical contact with the base 16. Located between the emitter 14 and the base polysilicon layer 20 is an emitter dielectric 22. The emitter dielectric 22 isolates the emitter from the base polysilicon layer 20.

As can be seen from the figure, the emitter 14 has a relatively wider upper region 24 that is located above the dielectric 22, and a relatively narrower region 26 that makes contact with the base 16. In particular, the upper region 24 of the emitter 14 extends beyond the lower region 26 of the emitter 14 on each side by a distance L1, and the upper region 24 overhangs the base 16 on each side by a distance L2.

The dopants used and the concentrations thereof in the collector region 12, the base 16, and the emitter 14 are conventional in nature, and will be implementation-specific. The polysilicon layer 20 includes a conventional dopant (such as boron) in a conventional concentration, but further includes an implanted substance such as carbon or germanium. The conventional dopant, such as boron, makes the polysilicon layer 20 suitably conductive to provide the necessary electrical connectivity to the base 16. The further implanted substance such as carbon or germanium prevents the boron from migrating or diffusing (typically during subsequent thermal processing) in a direction parallel to the surface of the semiconductor material from which the transistor 10 is formed, i.e. in a "horizontal" or lateral direction in FIG. 1. Such migration of the conventional dopant might otherwise contaminate the base 16 and adversely affect its characteristics.

Also, as will become more apparent in the description below, the fact that the emitter extends beyond the base 16 (by the distance L2) can be advantageously used in the manufacturing process to reduce the possibility of the base 16 being contaminated by the impurities that are implanted in the polysilicon layer 20 (boron and carbon or germanium in the example). When these impurities are implanted in the polysilicon, the emitter 14, suitably coated with photoresist to prevent contamination of the emitter 14, shields a portion of the polysilicon layer 20 that is adjacent to the base 16 from being implanted by the boron and carbon or germanium. By choosing a suitable distance L2 for the "overhang" of the emitter over the base, migration of the boron towards the base 16 into the shielded region of the polysilicon will be sufficient to provide the necessary electrical conductivity in this region, but will be too far for the boron to migrate substantially into (and thereby contaminate) the base 16. Similarly, contamination resulting from any migration by the further implanted substance (carbon or germanium in the example) into the base 16 from the polysilicon layer 20 is reduced or substantially eliminated.

Accordingly, contamination of the base 16 is reduced by two techniques that may be used in the alternative or preferably together. Firstly, migration of the dopant (boron in the example) from the polysilicon layer 20 into or towards the base 16 is reduced by the inclusion in the polysilicon layer 20 of a substance that reduces the ability of the dopant (boron in the example) to migrate. Secondly, by providing a region of the polysilicon layer 20 adjacent to the base 16 that initially has a reduced concentration of the dopant, a buffer region is provided into which the dopant can migrate before reaching the base 16. By appropriately selecting the size of the buffer region, the migration of the dopant is anticipated to provide a final concentration of the dopant in the buffer region such that the necessary final electrical characteristics of the polysilicon layer 20 are attained, while at the same time reducing or substantially eliminating contamination of the base 16 by the dopant used in the polysilicon layer 20. It is also advantageous to minimize the length of the region L2 for lower base resistance devices. The buffer region may advantageously be provided by extending the emitter 14 beyond the base 16 over the polysilicon layer 20, such that the buffer region is shielded during implant of the dopant as described in more detail below. Alternatively, a custom layer of photoresist layer may be used to provide the necessary shielding of the buffer region during implant of the dopant in the polysilicon layer 20.

By using the two techniques (described above) together, a synergistic benefit may be obtained. By providing a substance that reduces lateral migration of the dopant in the polysilicon layer, the size of the buffer zone (i.e. the distance L2) into which migration is expected, can be reduced. That is, the width of the upper region 24 of the transistor 10 may be reduced. This reduction in the size of the transistor advances the general aim of miniaturization and a particular goal of reducing the base resistance in the semiconductor device field.

Turning now to FIGS. 2 to 12, an exemplary method of making the transistor 10 of FIG. 1 will now be described.

Figure 2:
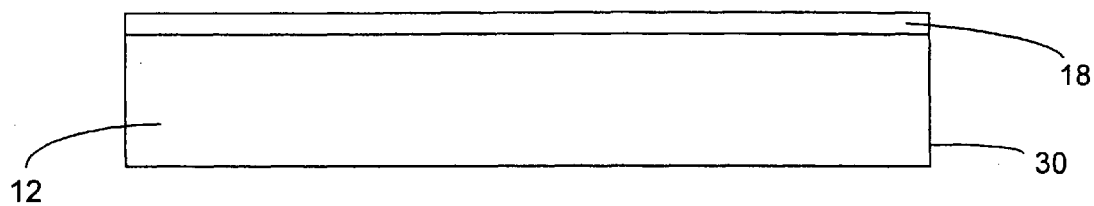
FIGS. 2 to 12 are schematic diagrams illustrating exemplary manufacturing steps used to create the bipolar transistor of FIG. 1.
Figure 3:
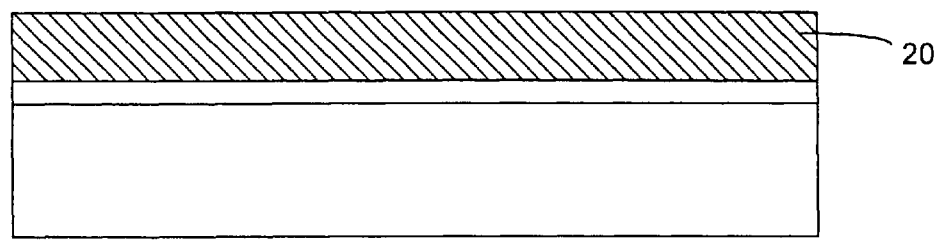

As shown in FIG. 2, the collector region 12.is formed by a n-type bulk region 30 (with a corresponding n-type dopant concentration) of a semiconductor substrate. The oxide (e.g. silicon dioxide) layer 18 is then deposited on the collector region using known techniques.

Then formed on top of the, oxide layer 18 is the thin polysilicon layer 20.

Figure 4:
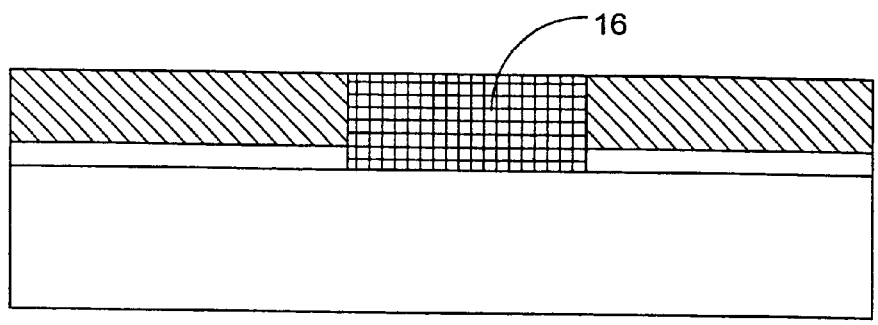

After formation of the polysilicon layer 20, a layer of photoresist is applied to the polysilicon layer 20. The photoresist layer is then exposed using a mask that defines an aperture for use in etching the base 16. The photoresist layer is then developed, and then an etching process is conducted to define an aperture that extends to the collector region 12. The base 16 (typically silicon germanium) is then formed by epitaxial deposition of Si, SiGe or SiGe:C. The top layer of the polysilicon layer 20 is consequently formed of Si, silicon germanium or SiGe:C alloy. The resulting structure is illustrated in FIG. 4.

Figure 5:
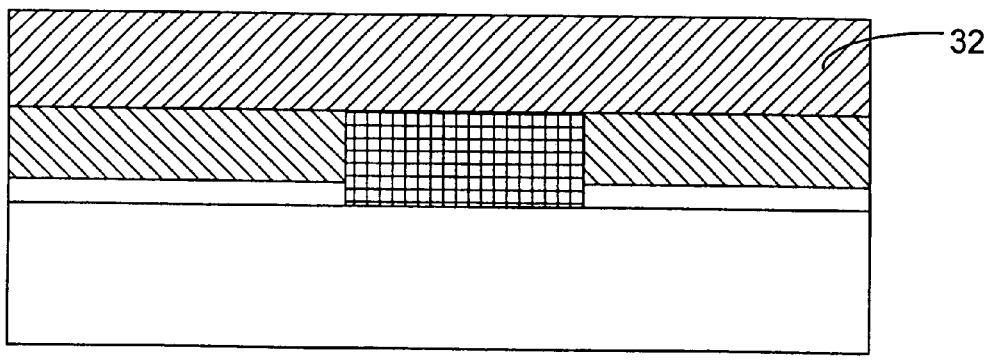
Figure 6:
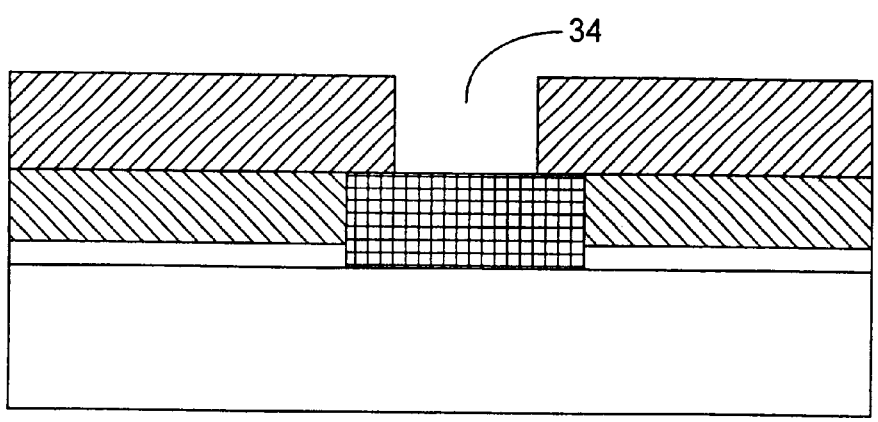
Figure 7:
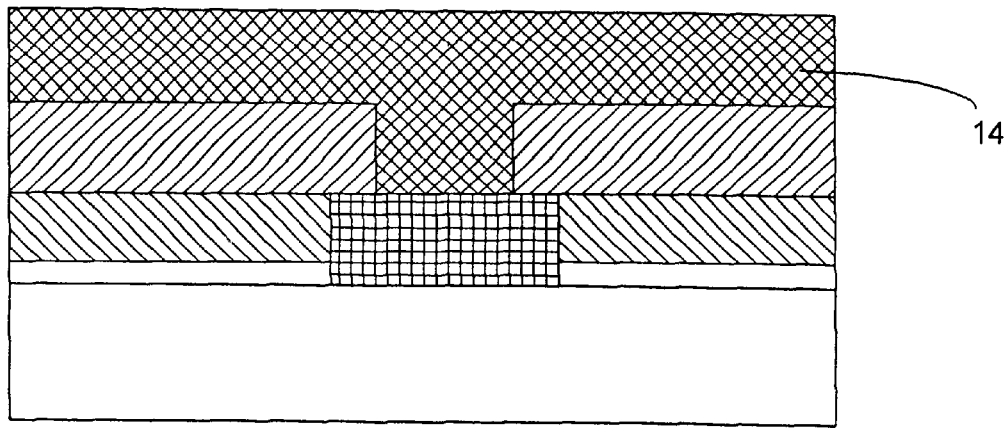
Figure 8:
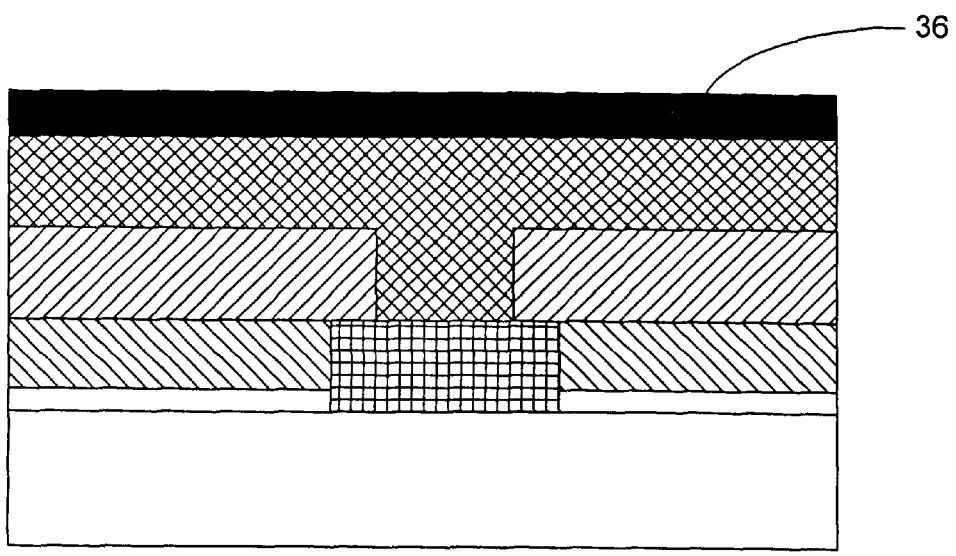

As shown in FIG. 5, a layer 32 from which the emitter dielectric 22 is to be formed is then deposited. Using known photolithographic and etching techniques, a window 34 is then opened into the layer 32 into which the emitter polysilicon is to be deposited, as shown in FIG. 6. The emitter polysilicon is then deposited and doped, as shown in FIG. 7, and a layer of photoresist 36 applied thereto as shown in FIG. 8.

Figure 9:
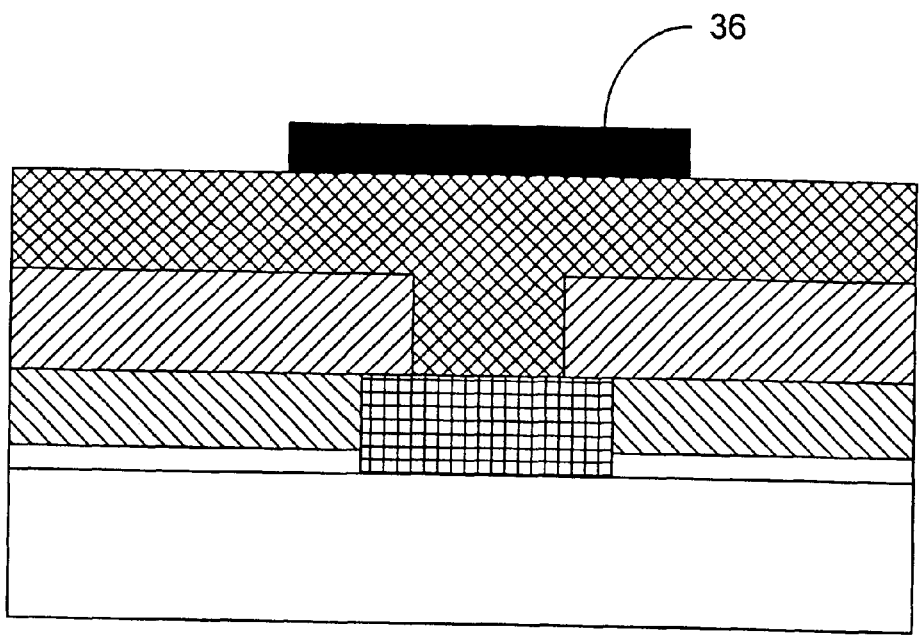
Figure 10:
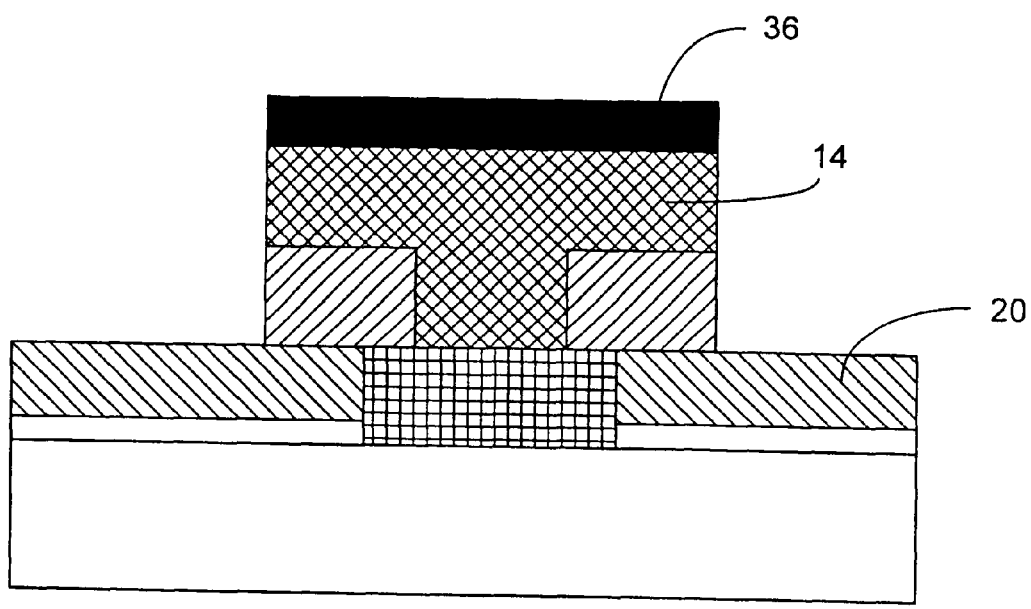

The photoresist layer 36 is then patterned as shown in FIG. 9, to define a shielded area 38 that will become the upper region 24 of the emitter 14. As shown in FIG. 10, an etching process is conducted to remove the superfluous emitter and emitter dielectric material.

At this stage, it will be appreciated that the remaining portion/shield 38 of the photoresist layer forms a shield that is dimensioned to permit the convenient doping of the polysilicon layer 20, such that the buffer zone (illustrated by the distance L2) in FIG. 1 will be created when the dopant is applied with the remaining portion present.

Figure 11:
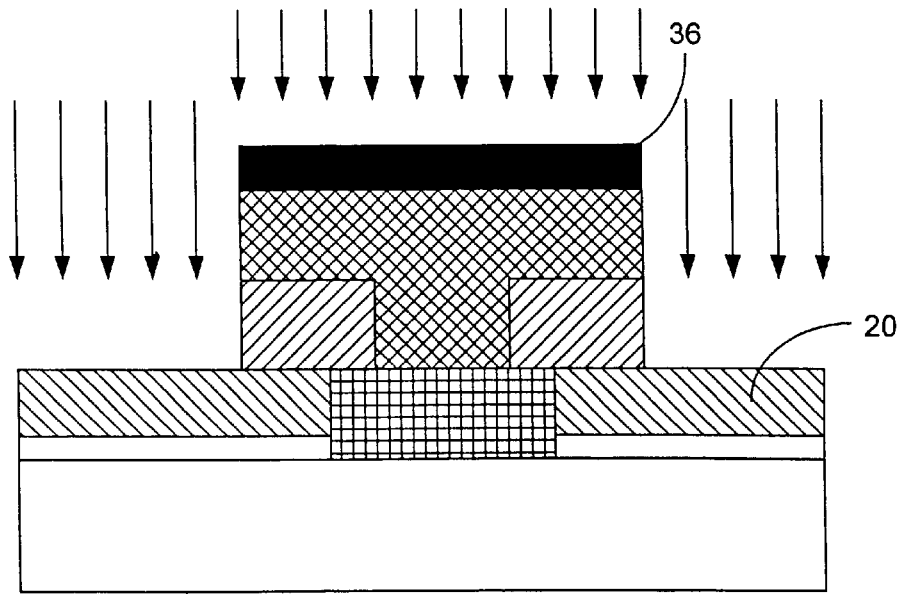

Accordingly, as shown in FIG. 11, the polysilicon layer 20 is implanted with a diffusion retarding dopant such as carbon or germanium. The implantation may be done prior to or at the same time as the implantation of the conventional dopant (boron in this example), and is preferably done by ion implantation at an energy of from about 10 keV to about 200 keV at a dose of from about $10^{14}$ to about $10^{16}$ ions per centimeter cubed (cc) for the germanium, and at an energy, of from about 2 keV to about 40 keV at a dose of from about $10^{13}$ to about $10^{15}$ ions/cc for the carbon. In the illustrated embodiment, the resulting germanium concentration in the polysilicon layer 20 is in the region of about 25% and the resulting carbon concentration in the polysilicon layer 20 is in the region of about 1% if these substances are used on their own. If they are used together, and appropriate fraction of these single concentrations is used, for example, 12.5% germanium, 0.5% carbon.

Figure 12:
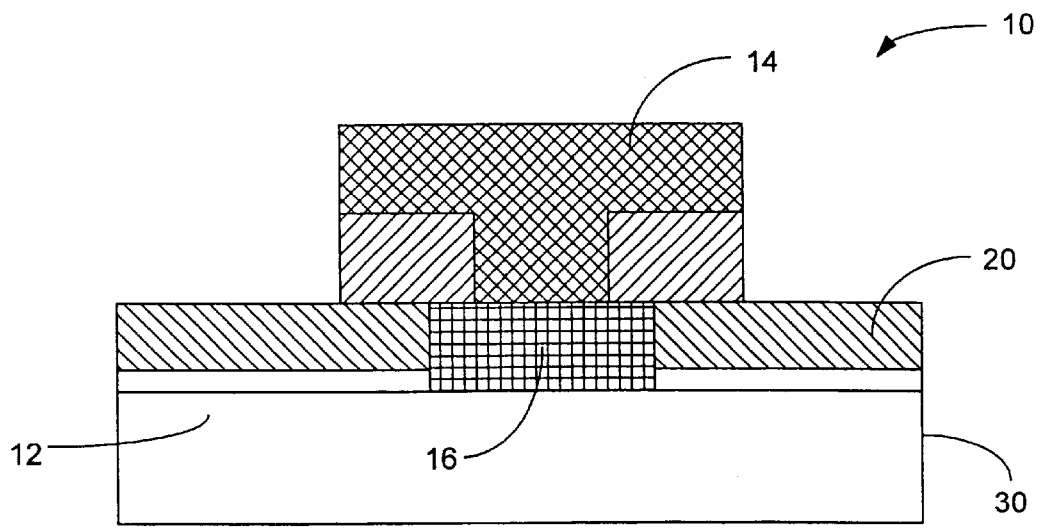

As shown in FIG. 12, the remaining portion of the photoresist layer 38 is then stripped, leaving the structure of the transistor 10 as shown in FIG. 1. In the illustrated exemplary embodiment, the distance L1≦0.15 microns the distance L2 is ≦0.1 micron, and the total width of the upper portion 24 of the emitter 14 is ≦0.45 micron (depending on the emitter size window). Also the thickness of the oxide layer 18 is 100 to 1000 angstrom, the thickness of the polysilicon layer 20 is 200 to 2000 angstrom, the thickness of the dielectric 22 is 100–1000 angstrom, and the total thickness of the emitter 14 is 500 to 2000 Angstrom. Note however, that these figures are only for purposes of illustrating an implementation of the invention, and may vary in practice depending on the implementation specifics.

Also, as an alternative to ion implantation after the polysilicon layer 20 has been formed, the diffusion-retarding dopants (carbon and/or germanium in this example) may be applied while the polysilicon layer 20 is being deposited, for example by providing a source of carbon or germanium while depositing the polysilicon layer 20 using low pressure chemical vapor deposition or rapid thermal chemical vapor deposition. In such a case, the source of carbon may be $Si(CH_3)H_2$ or possibly $C(SiH_3)_4$, while the source of germanium may be $GeH_4(SiCl_2H_2:GeH_4)$. Preferably, in such a case, the temperature is from about 550 to about 700 C. (more preferably around 625 C.), at a pressure from about 2 to about 100 Torr (more preferably from about 3 Torr to about 80 Torr), for a period of between 60 to 200 seconds. In addition, the $GeH_4$:DCS ratio is preferably around 0.05 to 0.2 depending on the temperature (more preferably around 0.1) and the $Si(CH_3)H_2$:DCS ratio is around 0.001 to 0.1 depending on the temperature (more preferably around 0.1 and 0.002, respectively). As before, the final germanium concentration in the polysilicon layer 20 is preferably around 25% and the final concentration of C in the polysilicon layer 20 is ≦0.5%. When proving a source of C or Ge while depositing the polysilicon layer 20, only a fraction of the total film is doped with these elements (approximately in the center of the film). This case does not provide as good a protection against unwanted diffusion as a film doped with Ge and/or C through out its thickness. Accordingly, ion implantation after the polysilicon layer 20 has been formed (or another technique that will provide this characteristic) is preferred.

CONCLUSION

In sum, variations to the embodiments described herein would be apparent to those of ordinary skill in the art. Accordingly it is intended that those variations would be within the scope and spirit of the present invention. It is also intended that the description be considered as encompassing equivalents thereof.

We claim:
1. A bipolar transistor comprising:
    a first polysilicon region formed on a semiconductor substrate,
    a second base region formed on the semiconductor substrate, the first polysilicon region being located generally adjacent to the second base region in a direction parallel to a general plane of the semiconductor substrate,
    the first polysilicon region including therein a dopant and a dopant diffusion retarding substance, and
    a buffer zone that has a significantly less amount of the dopant as compared to an amount of the dopant in the first polysilicon region, the buffer zone being between the first polysilicon region and the second base region.
2. The transistor of claim 1 wherein
    a diffusion distance for the buffer zone is based on an expected reduced diffusion as a result of the presence in the first polysilicon region of the dopant diffusion-retarding substance.
3. The transistor of claim 2 further comprising:,
    a third emitter region formed of semiconductor material, wherein the buffer zone is defined by an overlap between the third emitter region and the first polysilicon region.
4. The transistor of claim 3 wherein the dopant diffusion-retarding substance is a group IV element.
5. The transistor of claim 4 wherein the dopant diffusion-retarding substance is carbon or germanium.
6. The transistor of claim 1 wherein the dopant diffusion-retarding substance is a group IV element.
7. The transistor of claim 6 wherein the dopant diffusion-retarding substance is carbon or germanium.
8. A bipolar transistor comprising:
    a base region,
    an extrinsic base region being located generally adjacent to the base region,
    the extrinsic base region having implanted therein a dopant and a dopant diffusion-retarding substance, the dopant and dopant diffusion-retarding substance being implanted such that there is a buffer zone in the extrinsic base region, immediately adjacent to the base region, that has a significantly less amount of the dopant as compared to an amount of the dopant in the extrinsic base region.
9. The transistor of claim 8 wherein the buffer region is defined by an overhang of an emitter region over the base region.
10. The transistor of claim 8 wherein the dopant diffusion-retarding substance is a group IV element.
11. The transistor of claim 10 wherein the dopant diffusion-retarding substance is carbon or germanium.

* * * * *